United States Patent [19]
Casson et al.

[11] Patent Number: 5,727,310
[45] Date of Patent: *Mar. 17, 1998

[54] METHOD OF MANUFACTURING A MULTILAYER ELECTRONIC CIRCUIT

[75] Inventors: Keith L. Casson, Northfield; Carol Myers, Faribault, both of Minn.; Kenneth B. Gilleo, W. Kingston, R.I.; Deanna Suilmann, Bloomer, Wis.; Edward Mahagnoul, Faribault; Marion Tibesar, Northfield, both of Minn.

[73] Assignee: Sheldahl, Inc., Northfield, Minn.

[*] Notice: The portion of the term of this patent subsequent to Apr. 2, 2013, has been disclaimed.

[21] Appl. No.: 661,809

[22] Filed: Jun. 11, 1996

Related U.S. Application Data

[63] Continuation of Ser. No. 2,177, Jan. 8, 1993, abandoned.

[51] Int. Cl.$^6$ ..................................................... H05K 3/36
[52] U.S. Cl. .................................................. 29/830; 29/846
[58] Field of Search .............................. 29/830, 840, 843, 29/846, 852; 174/259, 262

[56] References Cited

U.S. PATENT DOCUMENTS

| | | | |
|---|---|---|---|
| 2,808,352 | 10/1957 | Coleman et al. | 117/227 |
| 3,148,310 | 9/1964 | Feldman | 317/101 |
| 3,205,299 | 9/1965 | Dickie | 174/84 |
| 3,320,658 | 5/1967 | Bolda et al. | 29/155.5 |
| 3,334,040 | 8/1967 | Conrad et al. | 204/266 |
| 3,359,145 | 12/1967 | Salyer et al. | 156/1 |
| 3,421,961 | 1/1969 | Joyce | 156/296 |
| 3,475,213 | 10/1969 | Stow | 117/227 |
| 3,491,056 | 1/1970 | Saunders et al. | 260/41 |
| 3,541,222 | 11/1970 | Parks et al. | 174/68.5 |
| 3,680,037 | 7/1972 | Nellis et al. | 339/61 |
| 3,774,232 | 11/1973 | May | 174/52 |
| 3,795,047 | 3/1974 | Abolafia et al. | 29/625 |

(List continued on next page.)

FOREIGN PATENT DOCUMENTS

| | | |
|---|---|---|
| 147856 | 7/1985 | European Pat. Off. . |
| 170703 | 2/1986 | European Pat. Off. . |
| 265212 | 4/1988 | European Pat. Off. . |
| 346525 | 12/1989 | European Pat. Off. . |
| 2475302 | 8/1981 | France . |
| 1065052 | 9/1959 | Germany . |
| 58-023174 | 2/1983 | Japan . |
| 61-49499 | 3/1986 | Japan . |
| 62-023198 | 1/1987 | Japan . |
| 2068645 | 8/1981 | United Kingdom . |
| 2123224 | 1/1984 | United Kingdom . |

OTHER PUBLICATIONS

Adachi, Kohei, "Packaging Technology for Liquid Crystal Displays", Solid State Technology, Jan. 1993, pp. 63–71.

Bolger, "Conductive Adhesives", Handbook of Adhesives, pp. 705–712 (date unknown).

(List continued on next page.)

Primary Examiner—P. W. Echols
Attorney, Agent, or Firm—Merchant, Gould, Smith, Edell, Welter & Schmidt, P.A.

[57] ABSTRACT

A heat resistant multilayer circuit board used in the transportation environment in cars, boats, planes, etc. having two or more conductive layers, with at least two conductive layers electrically and mechanically connected by an interconnecting adhesive layer, at least one of the conductive layers being affixed to a heat resistant substrate. The interconnecting adhesive layer comprises a conductive adhesive material having a plurality of deformable, heat fusible metallic particles dispersed substantially throughout a nonconductive adhesive. The fabricated multilayer circuit boards have interconnections which are reliable, heat resistant, and capable of withstanding thermal cycling and typical circuit board finishing and assembly processes.

28 Claims, 4 Drawing Sheets

U.S. PATENT DOCUMENTS

| | | | |
|---|---|---|---|
| 3,823,252 | 7/1974 | Schmid | 174/68.5 |
| 3,883,213 | 5/1975 | Glaister | 339/61 |
| 3,885,173 | 5/1975 | Lee | 310/9.4 |
| 3,904,934 | 9/1975 | Martin | 317/101 |
| 3,971,610 | 7/1976 | Buchoff et al. | 339/17 |
| 3,982,320 | 9/1976 | Buchoff et al. | 29/630 |
| 4,064,623 | 12/1977 | Moore | 29/629 |
| 4,065,197 | 12/1977 | Kuist et al. | 339/17 |
| 4,109,377 | 8/1978 | Blazick et al. | 29/626 |
| 4,113,981 | 9/1978 | Fujita et al. | 174/88 |
| 4,249,302 | 2/1981 | Crepeau | 29/830 |
| 4,261,042 | 4/1981 | Ishiwatari et al. | 364/709 |
| 4,388,136 | 6/1983 | Huie et al. | 156/252 |
| 4,457,796 | 7/1984 | Needham | 156/182 |
| 4,508,990 | 4/1985 | Essinger | 313/50 |
| 4,511,757 | 4/1985 | Ors et al. | 174/68.5 |
| 4,554,033 | 11/1985 | Dery et al. | 156/52 |
| 4,581,679 | 4/1986 | Smolley | 361/395 |
| 4,606,962 | 8/1986 | Reylek et al. | 428/148 |
| 4,610,756 | 9/1986 | Strobel | 156/645 |
| 4,628,022 | 12/1986 | Ors et al. | 430/280 |
| 4,629,681 | 12/1986 | Takada et al. | 430/314 |
| 4,642,160 | 2/1987 | Burgess | 156/630 |
| 4,645,552 | 2/1987 | Vitriol et al. | 156/89 |
| 4,659,872 | 4/1987 | Dery et al. | 174/117 |
| 4,680,226 | 7/1987 | Takeda | 428/327 |
| 4,713,494 | 12/1987 | Oikawa et al. | 174/68.5 |
| 4,729,809 | 3/1988 | Dery et al. | 156/306.6 |
| 4,737,112 | 4/1988 | Jin et al. | 439/66 |
| 4,744,850 | 5/1988 | Imano et al. | 156/265 |
| 4,751,126 | 6/1988 | Oodaira et al. | 428/139 |
| 4,771,537 | 9/1988 | Pryor et al. | 29/830 |
| 4,778,635 | 10/1988 | Hechtman et al. | 264/24 |
| 4,788,766 | 12/1988 | Burger et al. | 29/830 |
| 4,800,461 | 1/1989 | Dixon et al. | 361/398 |
| 4,814,040 | 3/1989 | Ozawa | 156/634 |
| 4,830,878 | 5/1989 | Kaneko et al. | 427/96 |
| 4,897,508 | 1/1990 | Mahulikar et al. | 174/52.4 |
| 4,926,549 | 5/1990 | Yoshizawa et al. | 29/876 |
| 5,041,183 | 8/1991 | Nakamura et al. | 156/264 |
| 5,046,238 | 9/1991 | Daigle et al. | 29/830 |
| 5,479,703 | 1/1996 | Desai et al. | 29/852 |
| 5,502,889 | 4/1996 | Casson et al. | 29/830 |

OTHER PUBLICATIONS

Excerpts from Compass Programme LCD materials, Technology/Market Update 5, pp. 5-14, pp. 11-14, and pp. 60-76 (1990).

Crea, John J., et al., "Development of a Z-Axis Adhesive Film for Flex Circuit Interconnects and Tab Outer Lead Bonding", Reprint NEPCON West '91 Proceedings, pp. 251-259.

Various Conductive Materials datasheets, Creative Materials Incorporated (1992-93).

*In re Gilleo*, Appeal No. 91-1326 (B.P.A.I. 1991).

Gilleo, "a New Multilayer Circuit Process Based on Anisotropicity", draft, published in Nepcon West proceeds, (Feb. 1991).

Gilleo, "Anisotropic Adhesives: Screen-printed Electronic Assembly" *SITE*, pp. 20-23 (Apr. 1988).

Grove, Bruce, *interConnection Technology*, Z-Axis Adhesive Film: Innovation in Electronic Interconnection, Dec. 1992.

Hitachi Anisotropic Conductive Film ANISOLM™ brochure.

Hitachi Anisotropic Conductive Film Anisolm AC-7073 product specifications (1993).

Kruetter, N.P., et al., "Effective Polymer Adhesives for Interconnect", 3M Austin, Tex.

Nipon Graphite Industries, Ltd. MONOSOTROPIC product brochure (1991).

"Pulse Heat Temperature Controller TC 1000" and Pulse Heat Thermal Compression Bonder RSM 4000 Elform product sheet.

Reinke, Roger R., "Interconnection Method of Liquid Crystal Driver LSIs by Tab-on-Glass and Board to Glass Using Anisotropic Conductive Films and Monosotropic Heat Seal Connectors", Elform, Incorporated, 41st Electronic Components and Technology Conference.

"Shel-zac™ Anisotropic Interconnect" Product Specification (Dec. 1991).

Sony Oriented Conduction Film Connectors CP1030 Technical Information brochure.

Sumitomo Bakelite Co., Ltd. Anisotropic Conductive Film SUMIZAC 1003 product brochure (1991).

3M, Scotch™ 9703 Conductive Adhesive Transfer Tape product brochure (1991).

"Z-link®" Multilayer Technology Product Specification (date unknown).

METHOD OF MANUFACTURING A MULTILAYER ELECTRONIC CIRCUIT

This is a continuation of application Ser. No. 08/002,177, filed Jan. 8, 1993 now abandoned.

FIELD OF THE INVENTION

The invention is directed to multilayer electronic circuits. More particularly, the present invention is directed to multilayer electronic circuits, used in transportation vehicles, having at least two electrically conductive layers mechanically and electrically connected by one or more layers of anisotropic conductive adhesive, at least one conductive layer thereof is affixed to a heat resistant substrate.

BACKGROUND OF THE INVENTION

Technology has progressed from the days of single layer circuit boards, where individual active and passive components were interconnected on a surface by metal leads, wires and conductive traces. Today, as electronic systems require greater speed and complexity in smaller and smaller packages, printed circuit designers have been encouraged to develop printed circuit boards having greater circuit densities. Much of the early advances in printed circuit technology involved reductions in scale, such as by decreasing the line thicknesses for conductive traces, combining multiple functions on integrated circuit chips, and directly mounting integrated circuit chips through surface mounting processes. However, by restraining the printed circuit patterns to a single layer, exceedingly complex and space consuming wiring had to be implemented. Often, long runs of wire had to be used, whose internal resistance and capacitance introduced unacceptable electronic limitations.

The logical next step in the development of printed circuit technology involved the creation of double-sided circuit boards. These circuit boards typically comprise two circuit layers fabricated on each side of an insulating substrate. The two circuit layers are then connected by means of conductors passing through the insulating layer. While early double-sided boards used insulating layers made of a rigid resin or ceramic material, many printed circuit boards in use today employ flexible substrates, typically made of a polyester or polyimide material.

Double-sided circuits today are typically manufactured by forming electronic circuit patterns on opposing surfaces of the insulating layer. The patterns are formed by methods such as electroless and electrolytic plating of the opposing surfaces of the insulating layer with a conductive metal. A photoresist is layered over the conductive metal platings and exposed to a light or other radiation image of the desired circuit pattern. Finally, the unexposed photoresist is removed, and the portion of the conductive metal plating from which unexposed photoresist has been removed is etched away to relieve the desired conductive circuit patterns.

The two circuit layers on a double-sided circuit board are typically connected by the plated-through hole (PTH) method, which involves fabricating holes through the insulating layer and forming a layer of plated copper along the surface of the hole to electrically connect both layers. When used for double-sided printed circuit boards, the PTH process is exceptionally reliable. Although the thermal coefficient of expansion (TCE) for the copper and the insulating layer do not precisely match, the short barrel length (i.e., the length of the hole) obviates any concern about thermal mechanical stress.

While double-sided printed circuit board technology did significantly increase circuit density, further advancements in electronic systems required greater circuit density than could be obtained from double-sided printed circuit boards. Consequently, multilayer printed circuit boards began to be developed, having two or more interconnected conductive layers. However, unique problems exist in the fabrication of these multilayer printed circuit boards which are not easily resolved by many prior art fabrication techniques.

By a conductive layer, we mean a layer of conductive material disposed generally in a plane having a conductive pattern, and usually having a plurality of contact pads defined thereon. Such a layer is typically made of copper or another conductive metal, and is capable of transmitting electronic signals between components and other conductive layers electrically connected to the conductive layer. Of the contact pads on a conductive layer, some are designated interconnect pads, for interconnecting the conductive layer with other conductive layers. Conductive layers may be attached to one or both sides of a substrate, to form single or double sided circuit boards, respectively.

By a multi-layer electronic circuit, we mean a circuit having two or more of these conductive layers superposed with at least a portion of each adjacent set of layers overlapping, such that the layers are mechanically connected, and such that interconnect pads located on the various conductive layers are electrically connected, to transfer signals between the various layers. Adjacent layers are electrically insulated from one another, apart from the electrical connections between the interconnect pads located thereon.

The most common technique for fabricating multilayer circuits is simply an extension of the plated through hole method for manufacturing double-sided circuits. Conventional multilayers have been made by imaging, exposing, and etching various interlayers of circuitry and then bringing all layers together in alignment. The layers are then laminated together in plies using a suitable insulating adhesive. The multilayer product is then usually pressed, e.g. by means of a platen. Subsequent to pressing a cure of the adhesive is often required. Through holes are then drilled to form barrels which are plated to create electrical contact between layers.

The PTH process for multilayer printed circuit board construction is extraordinarily complex and for many applications is not a particularly reliable method of manufacture. One problem is that a typical PTH process will require holes be fabricated which run throughout the entire stack of layers. This requires that all of the layers be precisely aligned so that a reliable connection is made in each desired layer. The more layers that are involved, the more difficult is the alignment. Should the alignment in any layer be off by a small amount, there is a high probability that the through holes will not contact all desired electrical connection points and perhaps will contact undesired electrical contact points, thus creating undesired open and short circuits.

Another problem with the PTH process is that significant space may be wasted on layers which are not interconnected at a hole. For instance, in a 30 layer multilayer printed circuit board, a connection between the 2nd and the 28th layer would essentially render the area required for the hole useless in all of the intervening layers. In a complex circuit having hundreds or thousands of interconnections, this loss could become significant, and have a substantial effect on the circuit density of the board.

Another disadvantage of the PTH process is that the holes typically need to be fabricated all of the way through the entire multilayer circuit board. Although it is possible to create internal holes to partially connect certain layers, this requires a number of iterations of the standard fabrication process in order to construct these partial connections, which adds cost and complexity to the process.

The fabrication of the holes themselves is an additional problem associated with PTH processes. In double-sided circuit boards, the fabrication of the holes is often not problematic. Especially with flexible substrates, the holes may be fabricated by a mechanical mass piercing process. A standard punch press piercing process allows thousands of holes to be formed concurrently in a single step. However, for multilayer printed circuits, the holes must be formed by drilling, which is a much slower and more costly process. As opposed to the concurrent stamping process of a double-sided board, the drilling method must drill each hole individually, significantly increasing the time required for fabricating the holes.

The drilling process creates a number of additional problems, as drilling through many layers of metal, insulating layer, dielectric adhesive, and prepreg (interlayer bonding material) produces considerable contamination. The copper laminating adhesive and layer-bonding prepreg smear into the hole walls as the friction-heated drill moves in and then out. Burrs are also formed on the hole walls. The smear and burr problem is intensified with higher layer counts for several reasons. Each circuit layer contains two layers of adhesive and prepreg, so more layers means more smear-producing substance. Higher layer count also means greater drilling length, longer drill time and more frictional heat build up. All of this adds up to considerable smearing.

Due to this smearing and burring, additional steps must be implemented in a PTH process, because the smearing and burring prevents good plating from occurring and will result in unreliable copper barrel formation. Desmearing processes include chemical attack with oxidizers and high energy plasma bombardment. Etchback, the controlled removal of non-metallic material from the hole, is also essential in order to expose internal conductors. Desmearing and etchback must be effective and well controlled to produce reliable multilayer circuits by the PTH process. Too little desmearing produces a weak PTH barrel, and too much etchback causes a rough, irregular barrel which is prone to fracturing. As the number of layers increases, the barrels become longer, and the desmearing/etchback processes become more difficult.

Strong oxidizing chemicals such as sulfuric acid, chromic acid and permanganate are used to clean and etchback non-metallics. The desmearing/etchback methods are effective although difficult to control. They add cost and complexity to the multilayer process. Alternatively, combinations of vacuum plasma techniques and chemical processing may be used to desmear and etchback the multilayer drilled holes. Plasma desmearing/etchback involves bombarding the drilled laminate with a high energy gas plasma in a vacuum chamber. This plasma is produced by subjecting gases, such as oxygen and fluorocarbons, to a high voltage. The process takes from 5 to 30 or more minutes, but the method is very effective, especially for polyimide. The equipment is expensive, however.

The plating process results in further difficulties for the PTH process. To be prepared for plating the holes must be sensitized for the copper plating. Sensitizers, like palladium, are deposited onto the side walls of the holes, in a series of sequential steps. The sensitized holes are next exposed to electroless copper bath. In the bath, the copper salt or complex plates out where it contacts the sensitizer or copper metal surface.

The electroless process is relatively slow to allow an even deposition to take place. Plating bath agitation can supply sufficient copper ions to accommodate the plating process in most cases. However, the electroless process is typically too slow to provide the necessary thickness required for a reliable copper barrel. Electroless copper also usually does not have the right microstructure to produce the required strength and electrical performance for a PTH hole.

Instead, electrolytic plating is used to build up the additional desired barrel thickness. The higher speed electroplating process generates a greater demand for copper ion replenishment, however. Copper ions must be rapidly forced into tiny holes. Furthermore, electrical current must be conducted throughout the barrel surface. The electrolytic copper PTH process must overcome ion depletion and current density variation in order to be successful.

The dual dilemma of ion depletion and current density are intensified as barrel length is increased and hole size is reduced. Aspect ratio, the numerical relationship of hole length to width, is a key parameter for through-hole plating. The higher the aspect ratio, the more difficult it is to transport copper ions into the center of the barrel. Also, the higher the aspect ratio, the more divergent the current density. These natural phenomenon team up to make high aspect ratio very difficult without sacrificing product quality and process efficiency. As the current density is higher at the edge of the barrel than in the middle because of the electrical resistance of the thin copper barrel, copper ions will plate out of solution onto the nearest charged copper surface, resulting in thinner copper deposit towards the center of the barrel. As the number of layers increases, this disparity in copper thickness will be intensified, effectively limiting the maximum number of layers that may be connected. In order to increase the number of layers above this physical limitation, the diameter of the holes needs to be increased, which further intensifies the problem of wasted space on non-connected layers.

Due to all of these difficulties encountered in the PTH process for fabricating multilayer circuit boards, it can be seen that the cost of fabrication may be great. As the process is typically slow due to the number of steps involved and the time required for a number of the steps, it can be seen that the productivity of such processes is less than optimal. Furthermore, due to the many difficulties faced in the typical process, it has been common in the art to have a significant number of rejected boards, especially when dealing with large boards having hundreds or thousands of interconnections and more than twenty layers. Some reject rates on complex boards may approach 90%. Obviously, then, if multiple attempts must be made to produce a workable product, the overall cost becomes exceptionally high.

Even after a multilayer board is successfully produced by the PTH process, the multilayer board may be extremely sensitive to varying environmental conditions. Thermal mismatch between copper and dielectric insulation operates to significantly limit the ability of these boards to accommodate changes in temperature. Furthermore, increasing the copper barrel length by adding more layers only increases the stress placed upon the metal-organic structure. This is the primary reason that the layer count on both rigid and flexible multilayer circuits has been limited.

When a multilayer circuit is heated, both the copper and the dielectric adhesive composite and insulating layers expand, but at different rates. The expansion of the organic insulating material is typically significantly greater than the metal. For every degree of temperature rise, structural stress increases. A critical point is reached where the stress exceeds the strength limits of the copper. A number of events can occur to relieve the stresses. The copper barrel may elongate or even rupture, causing catastrophic failure. The copper area around the barrel on the surface of the circuit may bend upward or crack. The copper pads, or annular rings, can be damaged to the point of failure or just to the point of reduced reliability. The pad bending mode is so prevalent that circuitry specifications often allow a certain amount to occur without rejection.

A number of other failure mechanisms, all based on thermal mechanical stress, can also occur. The net result is that the high layer count multilayer circuits have reduced reliability from the temperature stressing viewpoint.

One attempt to overcome the problems associated with PTH processes is shown in U.S. Pat. No. 3,795,047, issued to Abolafia et al. This reference describes a multilayer electronic circuit having limited areas of metal powder and epoxy selectively applied at electrical connection points between two conductive layers. In order to construct a multilayer circuit having two double-sided circuit boards stacked together, epoxy resin must first be applied to selected exposed metal portions on the top surfaces of the bottom two circuit boards. A layer of metal particles are then sprinkled over the entire top surfaces of those boards, and the boards are then moderately heated to make the epoxy tacky. The metal particles stick only to the areas of tacky epoxy. Excess metal particles are then blown or brushed off the top surfaces of the boards, so that only the particles clustered on the tacky epoxy on the connecting pads remain on the circuit boards. Next, thin layers of epoxy are placed across the surfaces opposing each of the surfaces with the selectively placed epoxy areas (the bottom surfaces of the top two circuit boards). All two boards are then carefully aligned, pressed together, heated and cooled. The cured epoxy holds the boards together, and the clusters of metal particles conduct between contact pads in the selective location.

Due to a number of problems associated with Abolafia et al., high density multilayer circuit boards may not be reliably produced with this method. The method of applying the metal particles at selective locations on the circuit board presents a number of problems. By "sprinkling" the metal particles, they are applied randomly throughout the top surfaces of the boards. Particles which are located on the same contact pad will most likely contact one another, and conduct in an x-y plane (the plane of the conductive layer). In Abolafia et al., this is not a problem due to the selective application of the metal particles. In addition, if the circuit board is very dense, and the area between contact pads is very small, some of the particles may bridge gaps between contact pads, and short circuit pads together. Finally, the random "sprinkling" process cannot be done in automated production lines and will probably leave some particles in areas which they are not desired, risking further short circuits. This is particularly problematic for boards having integrated circuit chips directly connected to the board by a surface mount technology (SMT) process. The metal particles may become lodged in between the chips and the board, or between adjacent chip connection points, furthering the risk of short circuits.

Another potential problem with Abolafia et al. is that the epoxy must be selectively applied to different points along the circuit board. For high density circuits with small line widths and spaces between lines, the registration of the epoxy may be difficult or even impossible to be performed reliably. This would further increase the probability of short circuits from the metal powder.

Finally, the process of Abolafia et al., while being significantly simpler than the PTH process, still requires a number of steps to adequately secure the boards together. The reference requires selective registration of adhesive, application of metal powder, removal of excess metal powder, additional registration of adhesive along the other surface, and finally, alignment, pressing and heating to create the full assembly.

Also related generally to the present invention are a number of references which disclose the use of anisotropic or z-axis conductive adhesives for mounting devices or replacing connectors on a circuit board. By a conductive adhesive, we mean an adhesive which may be used for both mechanical and electrical connection. These adhesives are typically comprised of some type of electroconductive particles disposed within an electrically insulating adhesive material, such that each particle is surrounded on all sides by the insulating adhesive.

For instance, the conductive adhesive disclosed in U.K. Patent Application No. 2,068,645 and French Patent Application No. 2,475,302, consists of a number of silver coated glass spheres disposed within a thermoplastic material. The conductive particles are sized such that one or two of them is sufficient to bridge the gap between opposed planar conductors.

Likewise, European Patent Application No. 265,212 entitled "Electroconductive Particles and Electroconductive Adhesive Containing Said Particles" discloses conductive particles which are fine polymer particles with a thin metal layer disposed on their surfaces. The adhesive in which the particles are disposed throughout is preferably coated on with a thickness which is preferably about 1 to 3 times the average particle diameter of the conductive particles.

The above references are similar in the fact that the conductive particles are non-deformable. This results in connections being formed and maintained by the pressure exerted by the adhesive in holding the conductive layers together. Connections formed with this pressure-acting method are, in general, only moderately reliable, and may be prone to failure, especially during thermal cycling.

European Patent Application No. 147,856 entitled "Electrically Conductive Adhesive Sheet, Circuit Board and Electrical Connection Structure Using the Same", discloses an electrically conductive adhesive sheet having a number of electrically conductive metal particles disposed within an insulating adhesive. The metal particles are typically deformable bodies such as solder particles. During a heat and pressure applying step, these particles are "squashed" between the conductive layers, and reflowed to form fused connections which are more reliable than the connections formed only from providing pressure.

None of the above references discloses conductive adhesives which may be used to construct multilayer circuit boards. Furthermore, none of the above references discloses a heat resistant multilayer circuit board that is tolerant to heating processing such as soldering. The conductive adhesives are instead used to provide interfaces between circuit boards and connectors or surface mounted components, typically after the circuit boards have been manufactured. They are typically substitutes for soldering, wire bonding, or for connectors.

As such, the conductive adhesives are not designed to handle a number of difficulties which exist in creating reliable and complicated multilayer circuit boards. Most importantly, these conductive adhesives are unable to withstand the temperatures required for component assembly.

This is because these adhesives are used after a circuit board has been completed. Much of the high temperature soldering processes have already been applied prior to the application of the adhesives. Therefore, they are not developed for the purpose of having heat resistant properties.

European Patent Application No. 346,525 entitled "Multilayer Electronic Circuit and Method of Manufacture" whose applicant is the same as the applicant of the present invention, discloses a multilayer electronic circuit comprising three or more electronic circuit layers connected by an interconnector layer which contains fusible solder particles. The quantity of the particles is selected to be sufficiently dispersed to prevent electrical conduction along the x and y axes and sufficiently concentrate and of a size to enable conduction along z axis.

However, the conductive adhesives above do not take into account for thermal expansion, as the applications for which they are used do not typically involve high or low temperatures. Due to a mismatch in thermal coefficients of expansion (TCE) between the adhesives and the insulating substrates or films which are being connected, the connections created by these conductive adhesives may inadvertently open during thermal cycling. Finally, the adhesives themselves may not be temperature resistant, and may soften or lose their bond ply under excessive temperatures. This problem is especially prevalent in the transportation area, for example, in automotive applications, where during the manufacture of the vehicle or in use, the circuit board may undergo repeated cycles of large temperature swing.

Therefore, a need exists for a multilayer circuit board having a plurality of conductive layers, which has reliable interconnections between layers that are capable of withstanding thermal cycling for use in the transportation environment. Furthermore, a need exists for a method of making such multilayer circuits which is less complex than the prior PTH processes and which produces reliable interconnections between many conductive layers. Yet furthermore, there is a need for an inexpensive multilayer circuit that is heat resistant, i.e. able to tolerate soldering where electronic components need to be affixed.

SUMMARY OF THE INVENTION

The invention relates to a heat resistant multilayer circuit board suitable for use in transportation applications, having at least two conductive layers, with at least two of these conductive layers mechanically and electrically connected by an interconnecting adhesive layer, wherein at least one of the conductive layers is affixed to a heat resistant substrate. A primary function of a motor vehicle is the transportation of people. Reliability of the vehicle, and therefore reliability of the electronic systems in the vehicle is critical for ensuring the safety of the personnel using the vehicle. A motor vehicle may be used for decades, it is important that the circuit boards in the vehicle do not malfunction due to thermal cycling and mechanical shock.

In the context of the present invention, a conductive layer is a layer of conductive material disposed generally in a plane having a conductive pattern and usually having a plurality of contact pads defined thereon. Such a layer typically is made of copper or another conductive metal, and is capable of transmitting electronic signals between components and other conductive layers electrically connected to the conductive layer. Further, in the context of the present invention, an interconnecting adhesive layer is a layer of conductive adhesive material having a non-conductive adhesive with a plurality of deformable metallic particles dispersed substantially uniformly throughout.

In accordance with the present invention, there is provided a solderable multilayer circuit board suitable for use in a transportation environment, having at least two conductive layers and an interconnecting adhesive layer interposed between at least two of the conductive layers for mechanically connecting the two conductive layers in a superposed relationship with a connected distance therebetween, and for electrically connecting corresponding interconnecting pads on the two conductive layers. The conductive layers each have a conductive pattern and a plurality of contact pads defined thereon. Further, at least one of these contact pads is designated an interconnecting pad which has a corresponding interconnecting pad on another conductive layer. At least one of these conductive layers is affixed to a heat resistant insulating substrate.

The interconnecting adhesive layer is conductive across a thickness thereof, and non-conductive throughout a coplanar direction thereof. It is disposed substantially throughout an overlapping portion of the two conductive layers, and is made of a plurality of deformable conductive metallic particles dispersed substantially uniformly throughout a non-conductive adhesive such that each particle is electrically insulated from substantially every other particle. The conductive metallic particles and the insulating substrate of the conductive layer have a substantially similar coefficient of thermal expansion and the particles have a maximum diameter that is about 90–110% of the distance between two conductive layers.

Also in accordance with the present invention, a method for making a solderable multilayer circuit board by electrically and mechanically connecting at least two conductive layers, at least one of which is affixed to a heat resistant substrate, is provided. This method consists of layering an interconnecting adhesive over a portion of one of two conductive layers to form an interconnecting layer, aligning another of two conductive layers to form an uncured assembly, such that the interconnecting layers are interposed between the two conductive layers, and subjecting the uncured assembly to an elevated temperature and a clamping pressure to form an interconnected assembly. The subjecting step results in an interconnecting layer which is conductive across a thickness thereof and non-conductive throughout a coplanar direction thereof, resulting in the two conductive layers being mechanically connected in a superposed relationship and electrically connected between corresponding interconnecting pads on the two conductive layers. The resulting multilayer circuit board is suitable for further component assembly because the portion where component soldering is needed is located on the conductive layer affixed to a heat resistant substrate. A heat sensitive substrate may be used where no component soldering is needed. A method of using such a multilayer circuit board for connecting to an electrical device for use in a transportation environment is also provided.

Multilayer circuits consistent with the present invention have a number of advantages over the prior art. First, fabrication is less complex and requires less critical steps. Furthermore, the connections formed between the conductive layers are, in general, less susceptible to thermal stress forces than those in many prior art interconnecting schemes. The interconnecting adhesive layer is also resistant to the effects of elevated temperatures.

Second, because the interconnecting metallic particles have a TCE which is substantially similar to the TCE of the insulating substrate (or substrates) used on the multilayer circuit, the internal mechanical stresses generated during thermal cycling will be reduced, the connections formed through the adhesive layer will be less likely to fail, and the circuit will better withstand thermal cycling and mechanical shock, which are particularly prevalent in transportation applications. This is significant because layer to layer joints only are made from one layer to the next opposite layer. High aspect ratio PTH joints are not produced.

Finally, the utilization of less expensive heat sensitive substrates in affixing conductive layers where no component soldering is necessary with the more expensive heat resistant substrates in affixing conductive layers where component soldering is needed reduces cost of production of solderable multilayer circuit boards.

These and other advantages and features, which characterize the invention are pointed out with particularity in the claims annexed hereto and forming a part hereof. However, for a better understanding of the invention, its advantages and objectives obtained by its use, references should be made to the drawing which forms further part hereof and to the accompanying descriptive matter, in which there is described a preferred embodiment of the invention.

BRIEF DESCRIPTION OF THE DRAWINGS

Referring to the drawings, wherein like numerals represent like parts throughout the several views.

DETAILED DESCRIPTION OF THE PREFERRED EMBODIMENT

For the purposes of discussing the workings of the present invention, the fabrication of a six-layer multilayer circuit will be disclosed as an example. This will serve to illustrate the principles embodying the present invention, and will facilitate the further discussion of alternative applications of the present invention in other embodiments. One skilled in the art will appreciate that multilayer circuits consistent with the present invention could have any number of conductive layers, even as much as 100 conductive layers or more.

Circuit Boards

Figure 1A:
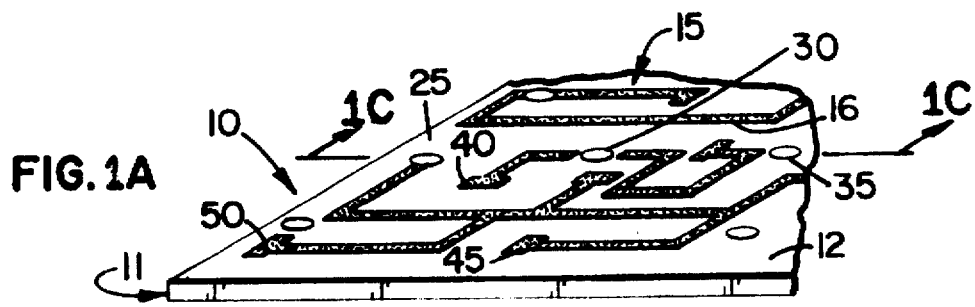
FIG. 1A is a perspective view of the top side of a double-sided circuit board for use with one embodiment of the present invention.
Figure 1B:
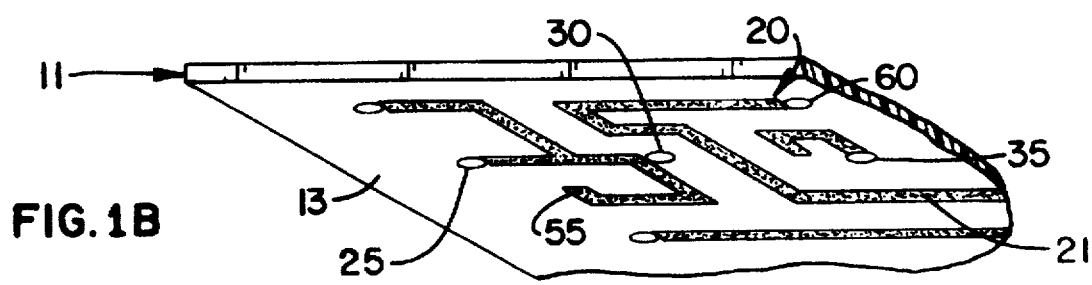
FIG. 1B is a perspective view of the bottom side of the double-sided circuit board of FIG. 1A.
Figure 1C:
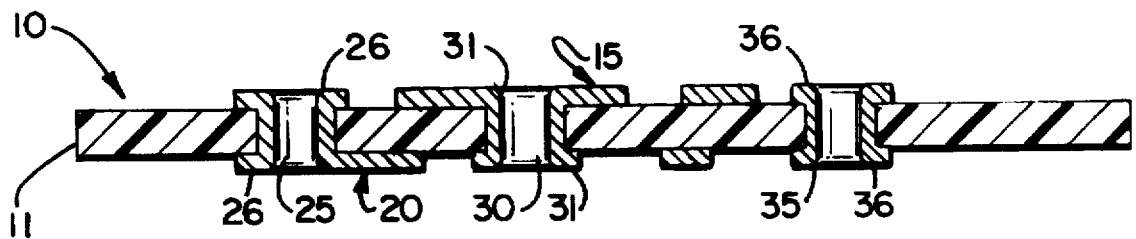
FIG. 1C is a sectional side view of the double-sided circuit board taken along line C—C in FIG. 1A.

A preferred six-layer multilayer circuit is fabricated by electrically connecting three double-sided circuit boards together in a superposed relationship. FIGS. 1A–C show a typical double-sided board for use in a multilayer circuit of this unique construction (not to scale). The double-sided circuit board 10 shown in the Figures is formed by adhering conductive layers on each side of an insulating substrate. Insulating substrate 11 can be any of a number of suitable dielectric materials such as ceramic, glass or organic polymers. Insulating substrate 11 will typically provide the significant portion of the physical strength of the multilayer circuit, so it should therefore have good strength characteristics. The substrate 11 may be a rigid material such as ceramic, glass, fabric or other composite materials, or it may be a flexible material such as polyester, polyimide, or other polymer, as well as laminate. Typical thickness of an insulating substrate can be from 12.5 to 125 microns.

On each surface of substrate 11 (top side 12 in FIG. 1A and bottom side 13 in FIG. 1B), conductive layers typically made of copper are formed thereon (15, 20). Upper conductive layer 15 has a pattern 16 of the various interconnecting lines defined thereon. Furthermore, it has a number of contact pads, such as 40, 45 and 50. Some or all of these pads are interconnect pads, which are used to electrically connect conductive layer 15 to another conductive layer located on another circuit layer. Likewise, lower conductive layer 20 on bottom side 13 of substrate 11 contains conductive pattern 21 of various interconnecting lines. Conductive layer 20 also includes a number of contact pads, such as pads 55 and 60, some or all of which are also interconnect pads used for connecting conductive layer 20 to another conductive layer on another assembly.

The minimum spacing between lines on a conductive layer may be as small as in the range of 25 microns. However, line spacing will generally be greater than 100 microns in most applications.

Conductive layers 15 and 20 are electrically connected through substrate 11 at various points by plated through holes, such as holes 25, 30 and 35. Copper layers 26, 31 and 36, formed along the inner surface of the holes 25, 30 and 35, respectively, provide the necessary electrical connections between the layers. Conductive layers 15 and 20 are formed on insulating substrate 11 by known methods such as electroless and electrolytic plating processes. These processes typically proceed by first plating top side 12 and bottom side 13 of substrate 11 with a conductive metal such as copper by electroless and/or electrolytic plating. A photoresist is then laid down over the conductive metal platings on each side of the substrate, and then the photoresist is exposed to a light or other radiation image of the desired circuit pattern. That is, a light image of pattern 16 applied to top side 12 of substrate 11, and a light image of conductive pattern 21 will be applied to bottom side 13 of substrate 11. The unexposed photoresist is then removed, and the portion of the conductive metal plating from which unexposed photoresist has been removed is etched away, leaving only the desired conductive circuit patterns. Typically the conductive layers formed will generally be 5 to 140 microns in thickness.

Also, a further process may be used to specially clean or treat the copper interconnecting pads to improve the wetting property of solder junctions on the pads. This may be performed by exposing the circuit boards to solutions containing sodium persulfate or sulfuric acid, for example.

The two conductive layers are interconnected through the insulating substrate by the plated through hole (PTH) process. These holes are preferably formed by mechanical piercing, rather than drilling, as is required for forming plated through holes through more than one insulating substrate. Drilling also makes an acceptable product, however. A conductive metal such as copper is then plated onto the walls of the holes by conventional electroless and/or electroplating methods. Because the length of the copper barrels is typically only a few mills (the total thickness of substrate 11 and conductive layers 15 and 20), thermomechanical stress is never a problem, even at relatively high processing or operating temperatures. In addition, the aspect ratios (the ratio of material thickness to hole diameter) of the holes are typically less than 1:1, unlike the high values which are required for traditional multilayer circuitry formed by PTH processes. A PTH hole for a continuous web double-sided flex circuit has an aspect ratio of greater than 1:3, rather than the 3:1 seen in traditional multilayer circuits. The copper plated through holes in the respective layers of the preferred multilayer circuit are, therefore, easier to produce and more reliable than traditional multilayer holes. They are also smaller in diameter and take up less "real estate" on each layer.

Finally, double-sided board 10 may further include active or passive circuit components formed thereon by known methods. These components can include semiconductor transistors or diodes, surface mounted integrated circuits, capacitors, or resistors (including thin or thick film resistors).

Anisotropic Conductive Adhesive

A multilayer circuit consistent with the present invention is formed having at least two conductive layers electrically and mechanically interconnected by a layer of anisotropic conductive adhesive. By anisotropic conductive adhesive, we mean an adhesive which, when layered between two conductive layers, will be electrically conductive at any point across a thickness thereof (also designated the z-axis), but will be electrically insulating throughout the layer in any coplanar direction (also designated x- or y-axis). While anisotropic conductive adhesives have been used as interconnections between a circuit and components, such as connectors, flat paneled displays, TAB (tape automated bonding), as well as to connect flexible circuits and membrane switches to rigid circuit boards, all of these applications only deal with a one-dimensional problem of connecting point A to point B. None of these applications have dealt with providing connections between a number of conductive layers in a z-axis, as the present invention is directed to.

The preferred conductive adhesive has a number of electrically conductive particles precisely dispersed in an electrically insulating adhesive material. The conductive adhesive, once manufactured, may either be coated, screen printed, or otherwise spread onto a conductive layer or alternatively, may be coated onto a release film and dried for later use.

The electrically conductive particles are large enough to span the connected distance between two conductive layers. That is, when two conductive layers are connected by a layer of conductive adhesive, the particles should have a maximum diameter sufficient to make physical contact between opposing interconnecting pads on the conductive layers. The size of the particles must be controlled by the connected distance between opposing conductive layers, rather than the thickness of the layer of conductive adhesive or the connected distance between insulating substrates. This is because the conductive adhesive will be layered substantially throughout the space between opposing insulating substrates. This dimension can vary greatly depending upon the thickness of the conductive layers, which may vary greatly based on the proper laminating process used. It is preferable that the particles have a size larger than the connected distance between opposing conductive layers, but no more than 10% over this distance. Furthermore, it is preferable that the particles are roughly the same size, for example with 80% of the particles having a maximum diameter within 20% of a mean maximum diameter. Also, the relationship between the maximum particle diameter and the minimum conductive line spacing will typically be greater than 1:3.

The particles are preferably deformable amorphous bodies. Particles are more preferably substantially spherical in shape, and made of a eutectic solder alloy. One preferred solder particle composition is a tin-lead eutectic solder, having a tin/lead ratio of 63:37 and a melt point of 361° F. Another preferred solder particle composition is a tin/lead eutectic solder, with a tin/lead/silver ratio of 62.5:36.1:1.4, with a melting point of 355° F.

It has also been found that more reliable connections may be made in some applications by adding a number of smaller conductive metallic particles to the conductive adhesive, which are not sized to span the connected distance between conductive layers. The use of the smaller particles, as well as the percentage of particles used, will vary depending on the application in which the conductive adhesive is to be used. For a preferred conductive adhesive used with a connected distance of 50 microns, it has been found that two sizes of particles should be mixed together in the insulating adhesive in equal portions for reliable connections. In the preferred conductive adhesive, a −200 to +325 mesh conductive powder is used in equal proportion with a −500 mesh conductive powder. However, it should be understood that reliable connections would still be made using larger particles which are within 10% of the connected distance of the conductive layers.

The insulating adhesive used in the conductive adhesive may be any dielectric substance, including, but not necessarily limited to, non-conducting plastics and resins, ceramics, and glasses. The insulating adhesive should have good wetting properties so as to completely coat each conductive particle so that, unless acted upon by external forces, the particles will stay dispersed and out of contact with one another. Preferably, the insulating adhesive is a thermosetting plastic. For a screen printable adhesive, a preferred composition of the base resin of the insulating adhesive is:

| Material | Solid Weight % |
| --- | --- |
| Butvar 90 (polyvinyl) | 74.78% |
| Cab-O-Sil (filler) | 7.79% |
| Antifoam A (wetting agent) | 1.24% |
| Epon 872 × 75 (epoxy) | 16.19% |

The base resin is prepared by first placing Cyclohexanone and Butyrolactone solvents into a mixer along with the Epon 872×75 and Antifoam A. Preferably a Daymax mixer may be used, with its three baffles installed at 90° in its walls, and with cold water circulating in the disperser jacket. For example, in order to prepare 10 gallons of base resin, the solvents, epoxy and wetting agent are added in the following quantities:

7399.9 ±15 grams of Cyclohexanone 7399.9 ±15 grams of Butyrolactone 571.6 ±1 gram of Epon 872–75

32.6 ±1 gram of Antifoam A

The mouth of the mixer is covered with a sheet of plastic film, the protective grid and port cover are put into place, and the mixer is activated for one minute. The mixer is then opened, and the following materials are added:

204.6 ±1 gram of Cab-O-Sil 1980.0 ±4 grams of Butvar 90

The mouth of the mixer is again covered with a sheet of plastic, the protective grid and port cover are put into place, and the mixer is activated for one minute ±10 seconds. The mixer is then opened, and any dry ingredients from the wall of the mixer is deposited in the center of the resin batch. The water is then turned on to the water jacket, the mouth of the mixer is covered with a sheet of plastic, the protective grid and port cover are put into place, and the mixer is activated for an additional 20 minutes. At this point, the resin must appear to be clear, and the butvar and Cab-O-Sil must be completely dissolved or dispersed. The base resin may now be drained into a polyethylene drum and sealed tightly for storage in a freezer.

Conductive particles and a phenolic resin are blended with the base resin in a separate process. The premixed base resin must first be allowed to reach room temperature (if frozen) before use. This base resin is first put into a blender and sheared (not whipped with high agitation) for 2–3 minutes, or until it is a fluid and pourable mixture, with care being taken to not heat the resin during mixing.

To form the conductive adhesive, the base resin and Union Carbide BLS 2700 phenolic resin are placed in a one quart explosion-proof blending jar and sealed in the following quantities:

602 ±1 gram of base resin
49.7 ±0.5 grams of Union Carbide BLS 2700

This mixture is sheared (not whipped) for 2–3 minutes, with care being taken not to allow the mixture to heat during mixing. Next, the conductive particles (63:37 tin:lead eutectic solder) are added in the following quantities:

102.3 ±0.5 grams of −200 to +325 mesh powder
102.3 ±0.5 grams of −500 mesh powder These particles are weighed separately in a clean glass beaker, and are added slowly to the slope of the vortex as the adhesive mixes. The mixture is then mixed for 1–2 minutes on low speed or until the conductive particles are uniformly distributed throughout, with care being taken not to allow the mixture to heat. The resulting conductive adhesive has the following composition:

| Material | Solid Weight % |
| --- | --- |
| base resin | 70.30% |
| −200 to +325 mesh powder | 11.95% |
| −500 mesh powder | 11.95% |
| BLS 2700 phenolic resin | 5.80% |

The thermosetting property of the adhesive enables the conductive particles to be firmly secured in place between the conductive layers. Migration of the particles is prevented by the thermoset adhesive, and as the adhesion and wetting properties of the adhesive effectively isolate each conductive particle. Therefore, once the adhesive is cured, no conduction will be possible between adjacent particles within the conductive layer, and the conductive adhesive layer will be substantially anisotropic.

The number of particles in a given volume of insulating adhesive must be determined statistically. In particular, the number of particles is chosen to keep the probability of short circuits between paths, along the x and y axis, to an acceptable minimum (usually less than one in one million). Within these constraints it is also desirable to maximize the current handling through a desired z-axis path, and if desired, to reduce the amount of surface area for interconnecting pads required to make good electrical contact. Usually the loading is between 10% and 30% by weight and should not exceed Critical Volume Loading (where the insulating adhesive does not coat all of the surface area of the particles). For the preferred conductive adhesive discussed above, the particle loading is 23.9%.

Good electrical contact between conductive layers usually requires that an electrical conductor contact the surface over a surface area at least sixteen times the thickness of the connecting area squared ($s = 16 \times t^2$), and preferably more than fifty times the thickness squared. Greater joint areas result in more durable and reliable circuit constructions.

In order to make the conductive adhesive resistant to the effects of temperature, the thermal coefficient of expansion for the conductive particles should be sufficiently matched with the TCE of any insulating substrates used in the multilayer circuit. This allows the conductive particles in the adhesive and the substrates to expand at substantially the same rate across the anisotropic bond ply thickness. For the preferred conductive adhesive, the TCE for the conductive particles is 25 ppm/° C. and the TCE for the insulating substrate is 20 (for polyimide films) to 27 (for polyester films) ppm/° C. Preferably, these values should be kept within 25% of one another. The adhesive without the particles has a TCE of 420 ppm/° C.

The measurement of TCE may be performed by using a thermal mechanical analyzer while exposing layers of material to be tested to varying temperatures. For example, one test cycle would be a 10° C./minute ramp back and forth between 25° C. and 200° C., with a 2 minute hold time at the first 200° C. reading.

Finally, the adhesive has a number of additional beneficial properties. It has a number of methods of application, including screen printing, selective application, and casting onto a film. Further, the adhesive may be drilled, punched, cut, etc. after being deposited and set.

The aforementioned formulation for the adhesive is given as preferred embodiments. It is possible to make and use other adhesives with different chemical composition as long as the thermal, mechanical and electrical properties are similar to adhesives disclosed herein.

Forming a Multilayer Circuit

In order to construct a six-layer multilayer circuit, it is preferable to stack three double-sided circuit boards and interconnect them using layers of anisotropic conductive adhesive interposed therebetween. One advantage of this configuration is that heat resistant insulating substrates can be used on the outer layers, and less expensive heat sensitive insulating substrates can be used for the inner layers. The heat resistant insulating layers for the outer insulating substrates may be, for example, ceramics, polyimides, epoxy glass combinations, and certain resins such as thermoset phenolics and PTFE's. Typically, these materials can tolerate and are operational at temperatures higher than the soldering temperature, which is in the range of 370 to 500° F. These heat resistant materials can maintain their dimensional integrity at a temperature of at least 500° F. Of course, where a ceramic material is used, the operational temperature of the ceramic layer can be much higher. On the other hand, the heat sensitive insulating substrates may be made of plastic materials such as polyethylene, polypropylene, polyethylene naphthalate, polyester, copolymers and combinations thereof. These materials, when not physically restrained by external structures, typically cannot withstand temperatures higher than 350° F without undergoing dimensional change due to softening of the polymer. Such multilayer circuits would be less expensive and/or thinner (using thinner heat sensitive substrates), while still being capable of withstanding the effects of heat during later soldering operations.

The solder particles which are disposed between interconnection pads form fused junctions between those pads. During reflow, the solder wets the surfaces of the copper interconnection pads and form bridges therebetween. In addition, the copper from the interconnection pads blends with the solder along the junctions between the solder and the pads to enhance the structural integrity of the junctions. The high metal surface tension prevents these "solder bridges" from ever opening. In addition, the ductility of the solder bridges reduces the possibility of breaking the bridges due to thermal expansion. Even at molten solder temperatures, surface tension holds the solder bridges together.

Furthermore, the adhesive, being cured, further secures the electrical connections in place. The thermosetting character of the adhesive locks the solder bridges in place, and prevents their migration through the structure. Due to the heat resistance and thermosetting character of the adhesive, the electrical connections will be maintained throughout subsequent heating operations like soldering, roll tinning and hot air leveling, and throughout thermal cycling. This is in contrast to many prior art conductive adhesives, which were designed for forming interconnections after circuit boards are completed. These previous conductive adhesives are not capable of withstanding the elevated temperatures required for subsequent fabrication processes as the present invention is directed.

Therefore, the fabrication process for the multilayer circuits consistent with the present invention are capable of being performed using less steps, and with less complexity than many prior PTH processes. Alignment is not as critical, and the complexities that are associated with drilling and plating the plated through holes is eliminated.

The connections provided by the preferred method are in general much more reliable than prior processes. They do not suffer from the same problems that are associated with long plated through holes which are required when multiple layers are joined together. Furthermore, under thermal cycling, the multilayer circuit constructed by the preferred method is more capable of withstanding thermal cycling. The prior PTH process creates plated through holes which extend throughout each layer of the multilayer circuit. As the number of layers increases, these holes become longer, and are therefore more susceptible to breaking due to thermal expansion. The connections provided by the preferred method in this invention, however, are made between layers one connection layer at a time, rather than all layers simultaneously. Therefore, as the number of conductive layers in the multilayer circuit increase, the susceptibility of the connections formed to thermal expansion does not increase. Further, because the TCE for the conductive particles and the substrates is matched, and because the solder material used is ductile, the solder bridges formed within the conductive adhesive layer will not be susceptible to breakage due to thermal expansion.

One obvious reason for the reliability of the conductive adhesive layer interconnections is that the method of connecting is face-to-face, rather than edge-to-edge as is found in PTH processes. This increases the peel and shear strength of the multilayer circuits.

Also, the conductive adhesive layer within the preferred multilayer circuit is capable of withstanding the high temperatures necessary for the subsequent fabrication processes which are typically performed on multilayer circuits. This may include soldering, IR reflow, roll tinning and hot air leveling. Many of the conductive adhesives in the prior art, as they are directed only to interconnections between completed circuit boards and components, do not provide this high temperature resistance, and therefore are not suitable for fabricating multilayer circuits.

One skilled in the art will appreciate that the method disclosed herein is suitable for creating a number of multilayer circuit boards besides those comprised of stacked double-layer circuit boards. For instance, the method of the present invention may be used to create double sided heat resistant circuit boards, or to connect back-bared layers together, single layer circuit boards to double layer circuit boards, rigid substrates to flex substrates, and flexible substrates to other flexible substrates. For example, single-sided circuits can be built and interconnected face-to-face with the anisotropic conductive layer. One single-sided circuit board can be made smaller than the other or cutouts be made in one board to provide external access to conductors, pads, etc. Double-sided circuit boards can also be made by building on back-bared layers un-supported by a dielectric substrate. The back-bared laminate is made by pre-punching a base film prior to laminating the copper foil to it or by laser scribing or chemical milling away the dielectric layer to allow access to the copper. With back-bared circuits, circuits can be connected together front-to-back as well as face-to-face using the interconnecting anisotropic connector.

Further, the method consistent with the present invention can be used to form multilayer circuits with large areas of heat sensitive substrates and smaller areas of heat resistant substrates. A less expensive heat sensitive substrate such as a polyester substrate may be used for providing the conductive lines between large areas along an instrument panel. A more expensive heat resistant material, such as a polyimide substrate can be prefabricated with a completed circuit consisting of active and passive components mounted thereon. The method of the present invention can be used to form a multilayer circuit in selective areas of these two substrates. The resulting multilayer circuit board is heat resistant in that heating processes such as soldering can be done on the multilayer board as a whole because at a location where heating is necessary, a heat resistant substrate is used for affixing the conductive layer. These multilayer circuits are particularly suitable for application in instrument panels, especially instrument panels of vehicles. Typically, an instrument panel has a large surface area but relatively little volume because the dimension perpendicular to the planar display of instruments is small. For example, in an automobile, there is typically ample planar area for display of instruments and devices such as gauges, indicator lights and switches, but very little space behind the dashboard. The utilization of multilayer circuit board will maximize the three dimensional space available for wiring and other mechanical and electronic devices. This is equally true for other vehicles such as ships and airplanes. More important, circuit boards used in the transportation environment undergo severe chemical, mechanical and thermal challenges that are not encountered by circuit boards used in typical office equipment. For example, in a modern vehicle, circuit boards are often used for the operation of brakes, ignition system, engine, as well as the control and/or monitoring of fuel dispensing, emission control, and electrical systems. When these systems are manufactured, repeated large temperature swings may take place. There may be painting, etc where solvent fumes may come into contact with the circuit boards. Some circuit boards may be located under the hood, under the car, behind the dashboard, or in various locations in a vehicle. In use, the circuit boards may be exposed to dust, solvents, water, dirt, or other foreign matters. The temperature swings can be very large. For example, the difference between the temperature under the hood of an operating automobile on a hot summer day and the temperature at the same location in a parked car in a winter night can be more than 150° F. Such circuit boards also undergo frequent mechanical challenges when the vehicle is in motion. Such mechanical shocks can easily worsen any weak link in the circuit board. If the conductor particles in the interconnecting layers of the multilayer circuit board have different TCE from that of the insulating substrates, the repeated thermal cycling would tend to move the conductive layers in relation to the interconnecters in a shearing action, leading eventually to mechanical weakening and failure of the interconnecting joints. Because the transportation of people is a primary function of practically any vehicle, reliability of the vehicle, and therefore reliability of the electronic systems of the vehicle is critical for ensuring the safety of the personnel on board. Typically a motor vehicle can last and may be used for decades. It is essential that circuit boards be able to take the physical and chemical abuse for extended periods of time without malfunctioning. By utilizing this invention, complete electronic circuits can be fabricated directly on the instrument panel circuit suitable for use in environments with thermal, mechanical, and chemical challenges, as in the transportation environment, without the need of wiring the electronics of the whole instrument panel in a high cost, heat resistant substrate such as polyimide. The use of flexible multiple layer circuit board can also reduce the mechanical stress on the board because the flexible nature of the board helps to absorb mechanical shocks. In a typical instrumental panel (for example, the control panel for the operation of equipment in a manufacturing plant), one may find gauges, switches, indicator lights, audiovisual devices, communication equipment, data recording equipment, etc. There can be measurement devices on the instrument panel. Exemplary measurement devices are: voltmeters, ammeters, ohmmeters, energy measurement devices, tachometers, pressure gauges, volume measurement devices such as level gauges in tanks, fuel gauges, force measurement devices such as spring gauges and loadcells, pH meters, flowmeters, temperature gauges, barometer, psychometric device, clock, and the like, as well as combinations thereof. There can also be displaying equipment which include indicator lights, warning lights, signal lights, liquid crystal displays, light emitting diode displays, cathode ray tube displays, flat panel displays, etc. The display devices may be also be analog or digital. On the instrument panel, there may be devices for controlling the operation of equipment. These controlling devices can be switches, or electromechanical devices such as potentiometer, tractball, mouse, etc. The electrical devices are affixed on an instrument panel mount, and these devices are electrically connected to circuit boards inside the instrument panel. An embodiment of the invention is an instrument panel of a manufacturing plant, for example, an chemical plant, a food processing plant, a steel plant, an automobile manufacturing plant and the like.

A preferred embodiment of this invention is in the instrument panel in motor vehicles such as in automobiles. For example, one may find on a typical automotive dashboard an odometer, speedometer, fuel gauge, temperature indicator light, low battery indicator light, check coolant light, check-oil light, check-engine light, high/low beam indicator light, brake indicator light and an alternator function indicator. In addition, there may be other display or control devices such as tachometer, thermometer, light switches, signal switches, emission monitoring device, window defogger, power window switches, cigarette lighter, audio equipment, etc. There may even be CB radio, communication equipment, television screen, etc. Any of these devices, or any combination thereof may be connected operationally and electrically to the multilayer circuit disclosed herein. The invention may also be associated with the brake system, the emission system, the ignition system, the electrical system, the fuel injecting system, the engine, the cooling system, the drive chain and the like. In these instances, the multilayer circuit board may be located not behind the dashboard, but in the vicinity of the device.

One skilled in the art will appreciate that the invention may be applied in the instrument panels of any vehicles, including vehicles such as other land-based vehicle; waterborne vehicles such as boats, ships, submarines, etc; airborne vehicles such as airplanes, helicopters, air-ships, etc; and even space vehicles such as space shuttles or rockets and the like. On an instrument panel of a waterborne vehicle, one may find additional devices such as sonar, direction indicating devices such as magnets, water displacement indicating devices, etc. )n the instrument panel of an airborne vehicle or space vehicle, one may find additional devices such as altimeter, gyroscope, pressure gauges, accelerometer, communication system, navigation system, and the like. The above-mentioned devices are given as illustrations of the application of the present invention. This invention is not limited by the electronic device to be connected to the multilayer circuit board.

EXAMPLE I

Multilayer Circuit Board

Figure 2:
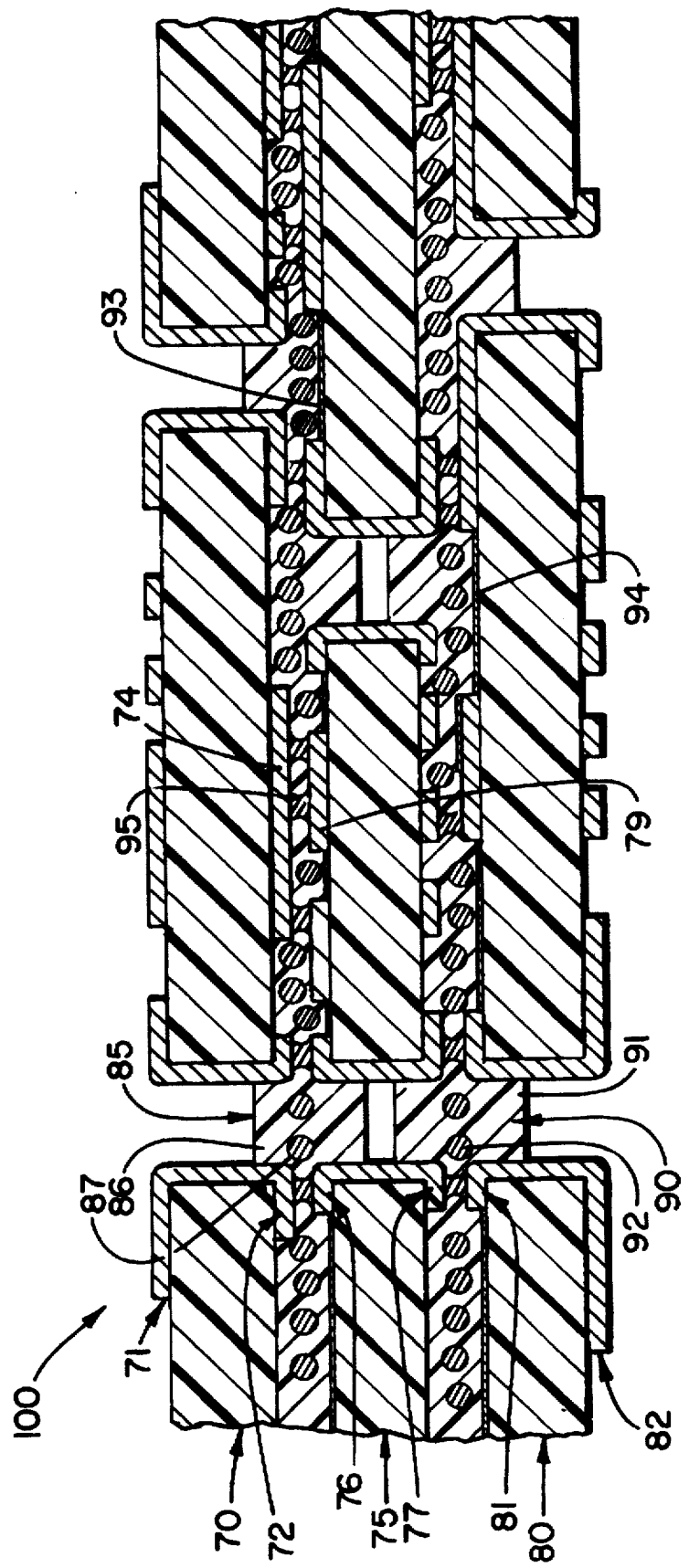
FIG. 2 is a side sectional view of a preferred six-layer multilayer circuit board.

FIG. 2 shows a six-layer multilayer circuit (not to scale). It is constructed of three double-sided circuit boards 70, 75 and 80. The top double-sided circuit board 70 has conductive layers 71 and 72 formed on the top and bottom surfaces, respectively, of insulating substrate 73. Likewise, the middle double-sided circuit board 75 has conductive layers 76 and 77 formed on the top and bottom sides, respectively, of insulating substrate 78. Finally, the bottom double-sided circuit board 80 has conductive layers 81 and 82 formed on the top and bottom sides, respectively, of insulating substrate 83.

The first step in constructing the multilayer circuit board 100 is to place coverlayers between adjacent conductive layers which are to be interconnected by conductive adhesive. A coverlayer is a thin dielectric film with selective openings corresponding to interconnect pads on each adjacent conductive layer. Its purpose is to insulate the two conductive layers at all locations except those places at which electrical connections are to be made. For example, coverlayers 93 and 94 are simply placed and aligned on the top sides of the bottom two circuit boards 75 and 80, respectively. One skilled in the art will appreciate, however, that the coverlayers could also be placed and aligned on the opposing sides of the boards, just as long as the coverlayers are between the two conductive layers.

It has been found that, when using a coverlayer, a reliable interconnection between two interconnecting pads through an aperture in the coverlayer may be formed. The reliability may be optimized as a function of the ratio between the size of the aperture in the coverlayer and the connected distance between the pads on the conductive layers. Preferably, this ratio is about 25 to 1, such that when the connected distance between the conductive layers is 50 microns, the diameter of the aperture should be around 1250 microns.

The step of applying a coverlayer is optional. Often it is not necessary to provide further insulation between adjacent conductive layers with proper design parameters, because the anisotropic conductive adhesive will prevent unwanted connections from being made in the x and y directions. Also, when using a coverlayer, additional plating of interconnecting pads may be included in order to raise the height of these pads in relation to the coverlayer. This will facilitate the "squashing" effect on the conductive particles located between interconnecting pads in certain applications.

The second step in constructing a multilayer circuit is to screen anisotropic conductive adhesive on the top sides of the bottom two circuit boards 75 and 80 to form interconnecting layers. If coverlayers are being used, this conductive adhesive layer will be located on top of the coverlayer as well. Typically, the thickness of this conductive adhesive layer will be in the range of 15 to 100 microns thick. A conductive adhesive may be screened across the entire top surface of the double-sided circuit boards, or may be selectively screened only in the areas where electrical connections are desired. However, it is important to note that due to the anisotropic nature of the conductive adhesive layer, it does not need to be placed only in the locations at which electrical connections are being made.

If the conductive adhesive is being screened only onto selective portions, the mesh should be built having openings which are 8 mils larger than the area which is to be layered with conductive adhesive. It has been found that it is preferable to use an 80 stainless steel mesh, and a squeegee having a 70 durometer hardness and a 26 psi pressure.

Once the conductive adhesive has been screened on each of the circuit boards, it is next dried in a heated conveyor oven set at 220°–250° F. for about 10 minutes. After being placed in the heated conveyor oven, the conductive adhesive becomes a B-stage adhesive.

The next step is to place and align each circuit board such that the interconnection pads on each conductive layer are properly aligned and disposed across from one another with the conductive adhesive interposed therebetween. The alignment step may be facilitated by using registering pins. While the proper alignment of the various layers is very important to the success of the fabrication process, it has been found that it is much simpler than many prior art systems such as PTH processes which require all layers to be simultaneously aligned for their success.

The next step is to laminate the entire uncured assembly to form the finished interconnected multilayer circuit assembly. The entire uncured assembly, with all of the double-sided circuit boards in alignment, is subjected to heat and pressure, preferably by a platen. Preferably this is performed at about 300 psi pressure and about 380° F. temperature. A number of things occur during this process. First, the coverlayers (if in place) are bonded to the top sides of circuit boards 75 and 80. Also, the adhesive in the conductive adhesive layer is cured to form the mechanical connection between the adjacent conductive layers. Finally, the conductive particles are reflowed or fused to form secure electrical contacts between corresponding interconnection pads. Typically, this pressing and heating step is performed in a 50–60 minute dwell time.

The pressing and heating may occur in a standard coverlayer press. Alternatively, for multilayer circuits with a large number of conductive layers (20 or more) the heating and pressing may be done in an autoclave press. Additionally, flexible circuits may be heated and pressed using a heated roll in a roll-to-roll process.

The fabricated multilayer circuit board shown in FIG. 2 therefore consists of six insulated conductive layers 71–72, 76–77 and 81–82. Insulating substrates 70, 75 and 80 are located between layers 71 and 72, 76 and 77, and 81 and 82, respectively. Furthermore, conductive adhesive layers 85 and 90 are interposed between layers 72 and 76, and 77 and 81, respectively. Finally, coverlayers 93 and 94 are bonded to the top sides of middle and bottom double-sided circuit boards 75 and 80, on top of conductive layers 76 and 81, respectively.

Figure 3:
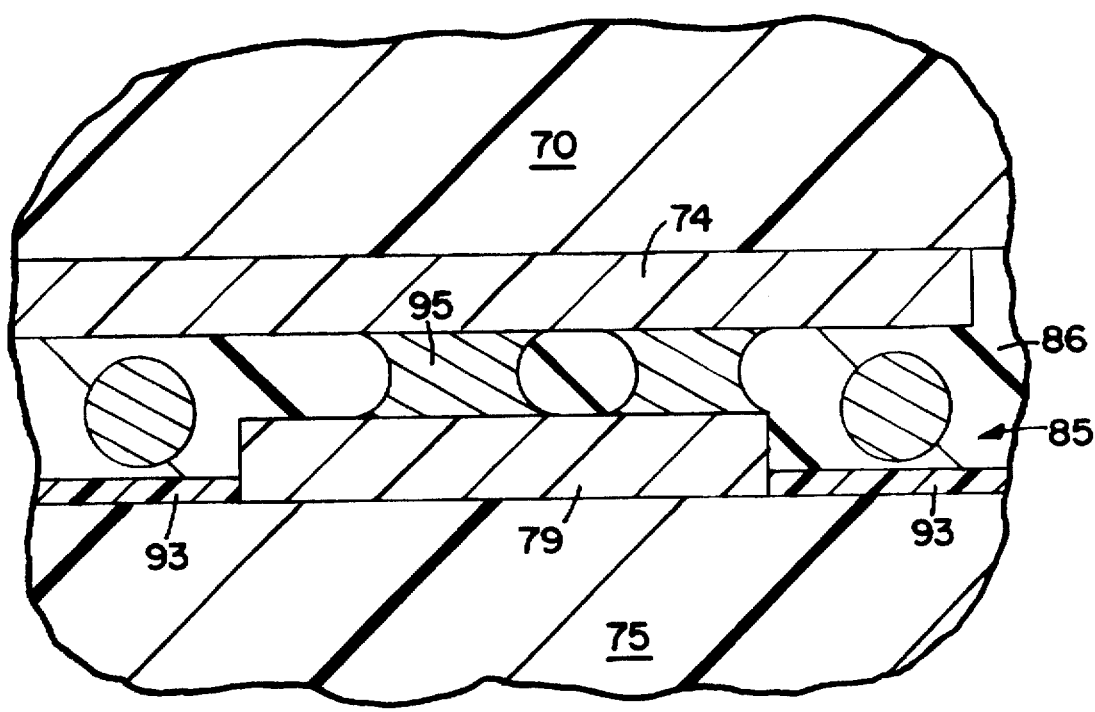
FIG. 3 is a fragmented side sectional view of an interconnection on the circuit board of FIG. 2.

As can be seen in FIGS. 2 and 3, conductive adhesive layers 85 and 90 each have connective particles 87 and 92 disposed within adhesive 86 and 91. Particles are not connected in areas in which there are no opposing interconnecting pads, or in which the coverlayers insulate opposing portions of the conductive patterns. However, at portions on the conductive layers in which corresponding interconnection pads are located, the connective particles have reflowed into solder bridges which provide secure electrical connections. For example, the particles 95 are deformed and fused in between interconnecting pads 74 and 79 on conductive layers 72 and 76, respectively.

EXAMPLE II

Flexible Heat Resistant Multilayer Circuit Board For An Automobile

Figure 4:
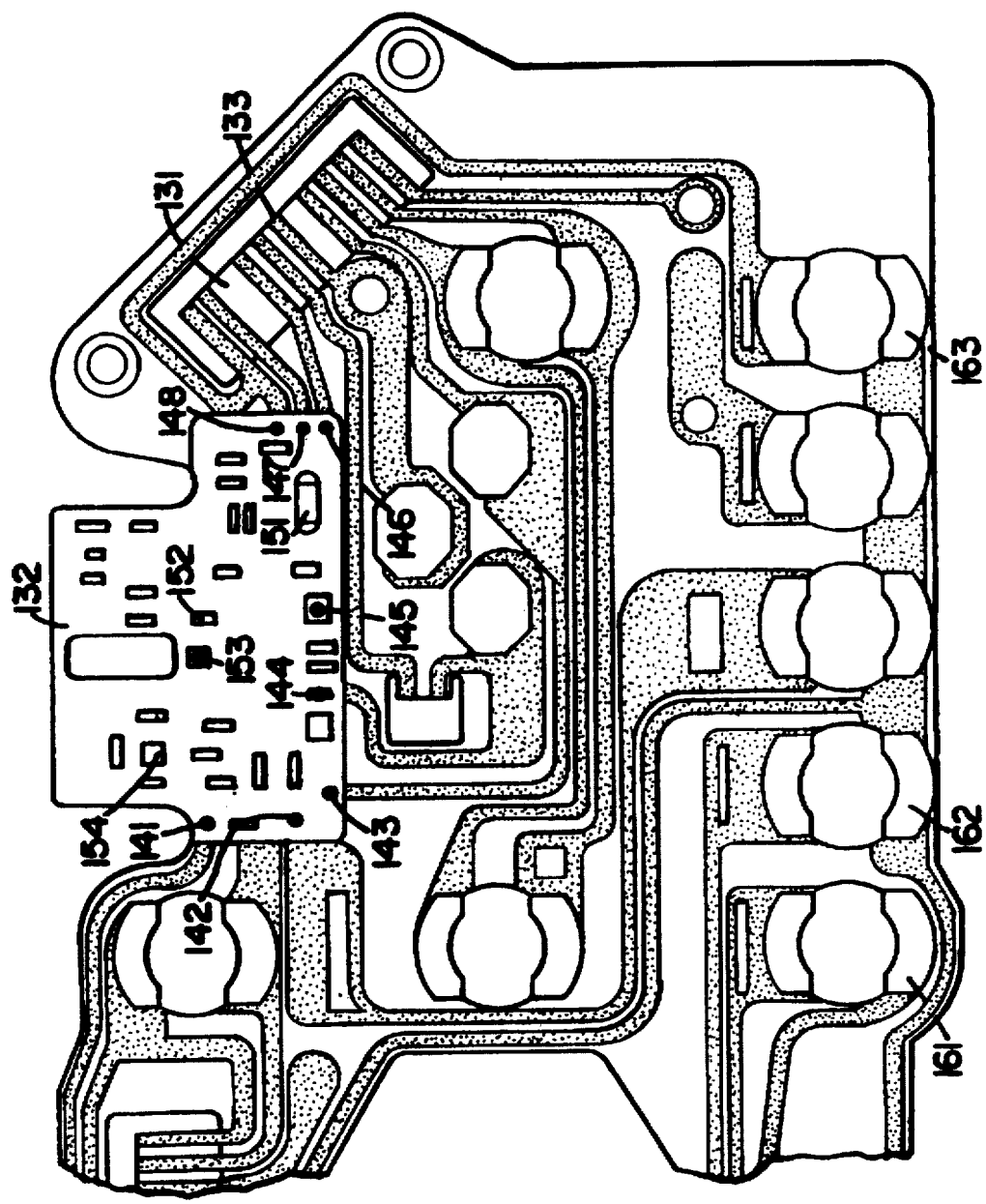
FIG. 4 is a fragmented plane view of the top side of a flexible multilayer heat resistant automotive circuit board with a heat resistant and a heat sensitive substrate.

In this example, only part of multilayer circuit board suitable for use in the automotive dashboard instrument panel is shown in FIG. 4. Therefore the circuitry shown in the figure is not a complete functional device. However, from the present disclosure, a person skilled in the art can apply the information disclosed to make multilayer circuit boards suitable for use in instrument panels, including automotive instrument panels. The previously stated technique for making the substrates, anisotropic interconnecting material, and techniques described in Example I was used to make the multilayer circuit board containing one layer of heat resistant substrate and one layer of heat sensitive substrate, as shown in FIG. 4. Referring to FIG. 4, a subassembly is built by affixing a conductive layer 133 on a flexible heat sensitive substrate 131. Copper contacting pads, for example, 161, 162, and 163 are made available for connecting to external electrical devices such as check-engine indicator, high/low-beam indicator, and parking brake indicator. This subassembly is connected by the interconnecting anisotropic layer located at positions 141, 142, 143, 144, 145, 146, 147 and 148 to a second flexible subassembly. The second subassembly is a double-sided circuit containing two conductive layers, each of which is affixed to a different side of a flexible heat resistant substrate 132. Electrical components, for example, 151, 152, 153, 154 are affixed to this heat resistant second subassembly.

Although the present invention has been described with reference to the preferred embodiments, workers skilled in the art will recognize that changes may be made in form and details without departing from the spirit and scope of the invention. The embodiments are given for illustrative purposes so that one skilled in the art may better understand and apply the invention, these embodiments are not to be interpreted to limit the scope of the invention, which are covered by the appended claims.

What is claimed is:

1. A method of making a multilayer circuit board suitable for use in a transportation environment comprising the steps of:

providing at least two conductive layers, each conductive layer having a conductive pattern and a plurality of contact pads defined thereon, at least one contact pad being designated an interconnecting pad, each interconnecting pad on a conductive layer having a corresponding interconnecting pad on another conductive layer, at least one conductive layer affixed to a heat resistant insulating substrate;

layering an electrically interconnecting adhesive over a portion of at least one of the conductive layers to form an interconnecting layer, the interconnecting adhesive comprising a non-conductive thermosetting adhesive having a plurality of deformable conductive metallic particles dispersed substantially uniformly throughout the non-conductive adhesive such that each particle is electrically insulated from substantially every other particle, the particles and the insulating substrate of the conductive layer having substantially similar coefficients of thermal expansion, the particles having a maximum diameter that is about 90–100% of a distance between the conductive layers;

aligning the conductive layers to form an uncured assembly, such that an interconnecting adhesive layer is interposed between two corresponding conductive layers with the interconnecting pads on each conductive layer aligned with their corresponding pads on the other conductive layer; and subjecting the uncured assembly to an elevated temperature and a clamping pressure to form an interconnected assembly, such that the interconnecting layer becomes conductive across a thickness thereof and non-conductive throughout a coplanar direction thereof, and such that the two conductive layers are mechanically connected in a superposed relationship with a connected distance therebetween and corresponding interconnecting pads on the two conductive layers are electrically connected.

2. The method of claim 1, wherein at least one conductive layer is affixed to a heat resistant insulating substrate consisting essentially of heat resistant material capable of maintaining dimensional integrity at a temperature of at least 370° F. and at least one conductive layer is affixed to a heat sensitive substrate consisting essentially of heat sensitive material capable of maintaining dimensional integrity at a temperature of no more than 350° F.

3. The method of claim 2 wherein the heat sensitive material is selected from the group consisting of polyethylene, polypropylene, polyester, polyethylene naphthalate, as well as copolymers or combinations thereof.

4. The method of claim 1 wherein the heat resistant material is selected from the group consisting of ceramics, polyimides, polyamides, epoxy glass combinations, fluorinated alkylene polymers, polymers of fluorinated ethylenepropylene (FEP), polymers of tetrafluorethylene (TFE), phenolics, as well as copolymers or combinations thereof.

5. The method of claim 1, wherein the heat resistant insulating substrate includes an additional conductive layer affixed thereto opposite the interconnecting layer, and wherein the method further comprises the step of, after subjecting the uncured assembly to an elevated temperature and a clamping pressure, mounting an electrical device to the additional conductive layer on the heat resistant insulating substrate using a high temperature fabrication process.

6. The method of claim 5, wherein the high temperature fabrication process is selected from the group consisting essentially of soldering, infrared reflow, roll tinning, hot air leveling, or combinations thereof.

7. The method of claim 5, wherein the conductive layers affixed to the insulating substrate are interconnected by means of plated through holes.

8. The method of claim 1, wherein the interconnecting layer further comprises a second plurality of deformable conductive metallic particles having a diameter smaller than the first plurality of particles.

9. The method of claim 1, wherein the particles are substantially spherical.

10. The method of claim 1, wherein 80 percent of the particles have a diameter within 20 percent of a mean diameter.

11. The method of claim 1, wherein the particles are made of a eutectic solder comprising 63 parts of tin and 37 parts of lead.

12. The method of claim 1, wherein the particles are made of a eutectic solder comprising 62.5 parts of tin, 36.1 parts of lead and 1.4 parts of silver.

13. The method of claim 1, wherein the coefficients of thermal expansion of the particles and the insulating substrate are within 25 percent of each other.

14. The method of claim 1, wherein each conductive layer is affixed to an insulating substrate.

15. The method of claim 14, wherein the insulating substrates are 12.5 to 125 microns thick, the conductive layers are 5 to 140 microns thick, and the interconnecting layer is 15 to 100 microns thick.

16. The method of claim 1, further comprising the step of interposing an electrically insulating coverlayer between one of the conductive layers and the interconnecting layer, and having apertures defined therein corresponding to the interconnecting pads on each conductive layer, wherein the conductive layers are interconnectable only through the apertures in the coverlayer.

17. The method of claim 16, wherein the step of aligning the electrically insulating coverlayer includes the step of selecting the diameter of the apertures in the coverlayer to provide a ratio between the diameter of the apertures and the connected distance between the conductive layers that optimizes the interconnection between opposing interconnecting pads.

18. The method of claim 17, wherein the ratio between the diameter of the apertures and the connected distance between the conductive layers is about 25 to 1.

19. The method of claim 18, wherein the connected distance between the conductive layers is about 50 microns and the diameter of the apertures is about 1250 microns.

20. A method of electrically connecting an electrical device to a circuit board suitable for use in a transportation environment, comprising the steps of:

(a) providing a multilayer circuit board suitable for use in the transportation environment, the multilayer circuit board including:

(i) first and second conductive layers, each conductive layer having a conductive pattern and a plurality of contact pads defined thereon, at least one contact pad being designated an interconnecting pad, each interconnecting pad on a conductive layer having a corresponding interconnecting pad on another conductive layer, at least one conductive layer affixed to a heat resistant insulating substrate having a third conductive layer affixed to an opposing surface of the heat resistant insulating substrate; and (ii) an electrically interconnecting adhesive layer interposed between the first and second conductive layers for mechanically connecting the first and second conductive layers in a superposed relationship with a connected distance therebetween, and for electrically connecting corresponding interconnecting pads on the first and second conductive layers, the interconnecting layer being conductive across a thickness thereof and being non-conductive throughout a coplanar direction thereof, and being disposed substantially throughout an overlapping portion of the first and second conductive layers, the interconnecting layer comprising a non-conductive adhesive having a first plurality of deformable conductive metallic particles dispersed substantially uniformly throughout the adhesive such that each particle is electrically insulated from substantially every other particle, the particles and the heat resistant insulating substrate having substantially similar coefficients of thermal expansion, and the particles having a diameter that is about 90–110% of the distance between the first and second conductive layers; and (b) electrically and mechanically connecting an electrical device to the third conductive layer on the heat resistant insulating substrate using a high temperature fabrication process.

21. The method of claim 20, wherein the second conductive layer is affixed to a heat resistant insulating substrate consisting essentially of heat resistant material capable of maintaining dimensional integrity at a temperature of at least 370° F. and wherein the first conductive layer is affixed to a heat sensitive substrate consisting essentially of heat sensitive material capable of maintaining dimensional integrity at a temperature of no more than 350° F.

22. The method of claim 21 wherein the heat sensitive material is selected from the group consisting of polyethylene, polypropylene, polyester, polyethylene naphthalate, as well as copolymers or combinations thereof.

23. The method of claim 20 wherein the heat resistant material is selected from the group consisting of ceramics, polyimides, polyamides, epoxy glass combinations, fluorinated alkylene polymers, polymers of fluorinated ethylene-propylene (FEP), polymers of tetrafluorethylene (TFE), phenolics, as well as copolymers or combinations thereof.

24. The method of claim 20 wherein the multilayer circuit board is used in a land-based vehicle.

25. The method of claim 20 wherein the multilayer circuit board is used in an instrument panel of an automotive vehicle.

26. The method of claim 20 wherein the multilayer circuit board is used in a waterborne vehicle.

27. The method of claim 20 wherein the multilayer circuit board is used in an airborne vehicle.

28. The method of claim 20, wherein the high temperature fabrication process is selected from the group consisting essentially of soldering, infrared reflow, roll tinning, hot air leveling, or combinations thereof.

* * * * *